United States Patent
Yao

(10) Patent No.: US 7,202,102 B2
(45) Date of Patent: Apr. 10, 2007

(54) DOPED ABSORPTION FOR ENHANCED RESPONSIVITY FOR HIGH SPEED PHOTODIODES

(75) Inventor: Jie Yao, Princeton, NJ (US)

(73) Assignee: JDS Uniphase Corporation, Milpitas, CA (US)

( * ) Notice: Subject to any disclaimer, the term of this patent is extended or adjusted under 35 U.S.C. 154(b) by 131 days.

(21) Appl. No.: 10/736,859

(22) Filed: Dec. 16, 2003

(65) Prior Publication Data
US 2005/0017317 A1    Jan. 27, 2005

Related U.S. Application Data

(63) Continuation-in-part of application No. 10/304,202, filed on Nov. 26, 2002, now abandoned.

(60) Provisional application No. 60/333,616, filed on Nov. 27, 2001.

(51) Int. Cl.
    *H01L 21/00*   (2006.01)
    *H01L 31/00*   (2006.01)

(52) U.S. Cl. ......... 438/69; 257/E31.061; 257/E21.336; 257/E31.035; 257/E21.125

(58) Field of Classification Search ................ 257/656; 438/69
    See application file for complete search history.

(56) References Cited

U.S. PATENT DOCUMENTS

| | | | | |
|---|---|---|---|---|
| 4,069,492 A | * | 1/1978 | Pankove et al. ............... 257/79 |
| 4,137,543 A | * | 1/1979 | Beneking ..................... 257/184 |
| 4,217,598 A | * | 8/1980 | d'Auria et al. ................ 257/85 |
| 4,527,179 A | * | 7/1985 | Yamazaki ..................... 257/13 |
| 4,581,476 A | * | 4/1986 | Yamazaki ................... 136/258 |
| 4,784,702 A | * | 11/1988 | Henri ......................... 136/258 |
| 4,904,859 A | * | 2/1990 | Goossen et al. ........ 250/214 R |
| 4,987,460 A | * | 1/1991 | Takasu et al. .............. 257/103 |
| 5,073,809 A | * | 12/1991 | Bigan et al. ................. 257/458 |
| 5,144,406 A | * | 9/1992 | Hemings et al. ............ 257/656 |
| 5,256,887 A | * | 10/1993 | Yang ............................. 257/53 |
| 5,329,150 A | * | 7/1994 | Schubert et al. ............ 257/458 |
| 5,621,238 A | * | 4/1997 | Dodd et al. ................. 257/440 |
| 5,684,308 A | | 11/1997 | Lovejoy ..................... 257/184 |
| 5,726,084 A | * | 3/1998 | Boyd et al. ................. 438/239 |
| 5,818,096 A | * | 10/1998 | Ishibashi et al. ............ 257/458 |
| 5,949,564 A | * | 9/1999 | Wake ......................... 398/168 |
| 6,020,620 A | * | 2/2000 | Kusakabe ................... 257/436 |
| 6,242,764 B1 | * | 6/2001 | Ohba et al. ................. 257/190 |

(Continued)

OTHER PUBLICATIONS

Ultrafast, dual-depletion region, InGaAs/InP p-i-n detector□□Effenberger, F.J.; Joshi, A.M.;□□Lightwave Technology, Journal of□□vol. 14, Issue 8, Aug. 1996 pp. 1859-1864 □□.*

(Continued)

*Primary Examiner*—Walter Lindsay, Jr.
*Assistant Examiner*—Thu-Huong Dinh
(74) *Attorney, Agent, or Firm*—Allen, Dyer, Doppelt, Milbrath & Gilchrist, P.A.

(57) ABSTRACT

A photodiode with a semiconductor intrinsic light absorption layer has at least one p-doped light absorption layer or an n-doped light absorption layer, and preferably both. The diode also has a cathode electrode and an anode electrode electrically coupled with the p-doped light absorption layer or the n-doped light absorption layer.

6 Claims, 2 Drawing Sheets

SAM-APD

U.S. PATENT DOCUMENTS

| | | | | |
|---|---|---|---|---|
| 6,246,094 B1 * | 6/2001 | Wong et al. | ............... | 257/397 |
| 6,265,727 B1 * | 7/2001 | Kozodoy et al. | ............. | 257/21 |
| 6,395,511 B1 * | 5/2002 | Brunkow et al. | .......... | 435/69.1 |
| 6,492,704 B1 * | 12/2002 | Coroy | ......................... | 257/461 |
| 6,740,908 B1 * | 5/2004 | Giboney | ..................... | 257/185 |
| 6,784,505 B2 * | 8/2004 | Zeng | .......................... | 257/397 |
| RE38,582 E * | 9/2004 | White | ......................... | 257/448 |
| 7,110,034 B2 * | 9/2006 | Suda | .......................... | 348/340 |

OTHER PUBLICATIONS

Metamorphic graded bandgap InGaAs-InGaAlAs-InAlAs double heterojunction p-i-l-n photodiodes☐☐Jae-Hyung Jang; Cueva, G.; Hoke, W.E.; Lemonias, P.J.; Fay, P.; Adesida, I.;☐☐Lightwave Technology, Journal of☐☐vol. 20, Issue 3, Mar. 2002 pp. 507-514.*

InGaAsPN/InP based photodetectors for long wavelength (λ>1.65 μm) applications☐☐Wei, J.; Gokhale, M.R.; Thomson, J.; Forrest, S.R.;☐☐Lasers and Electro-Optics Society 1999 12th Annual Meeting. LEOS '99. IEEE☐☐vol. 2, Nov. 8-11, 1999 pp. 742-743.*

High-frequency InP/InGaAs pin photodiodes with efficient response at short wavelengths Diadiuk, V.; Alexander, S.B.; Groves, S.H.; Spears, D.L; Indium Phosphide and Related Materials, 1991., Third International Conference.*

Yao, Jie et al., *Bandwidth Simulations of 10 Gb/s Avalanche Photodiodes*, IEEE, pp. 699-700.

Shimizu et al., "InP-InGaAs Uni-Traveling-Carrier Photodiode With Improved 3-dB Bandwidth of Over 150 GHz", IEEE Photonics Technology Letters, vol. 10, No. 3, Mar. 1998, pp. 412-414.

Kato et al., "Design of Ultrawide-Band, High Sensitivity p-i-n Photodectors", Journal of Lightwave Technology, vol. 8, Issue 4, 1990, pp. 531-537.

S.L. Chuang, *Physics Of Optoelectronic Devices*, Wiley Series in Pure and Applied Optics, John Wiley and Sons, 1995.

Hollenhorst, "Frequency Response Theory for Multilayer Photodiodes", Journal of Lightwave Technology, vol. 8, No. 4, Apr. 1990, pp. 531-537.

S.M. Sze, *Semiconductor Devices Physics and Technology*, p. 283.

Streetman, *Solid State Electronic Devices*, Prentice Hall Series in Solid State Physical Electronics, Third Edition, pp. 217-219.

Kato, Ultrawide-Band/High-Frequency Photodetectors,IEEE Transactions on Microwave Theory and Techniques, vol. 47, No. 7 Jul. 1999, pp. 1265-1281.

* cited by examiner

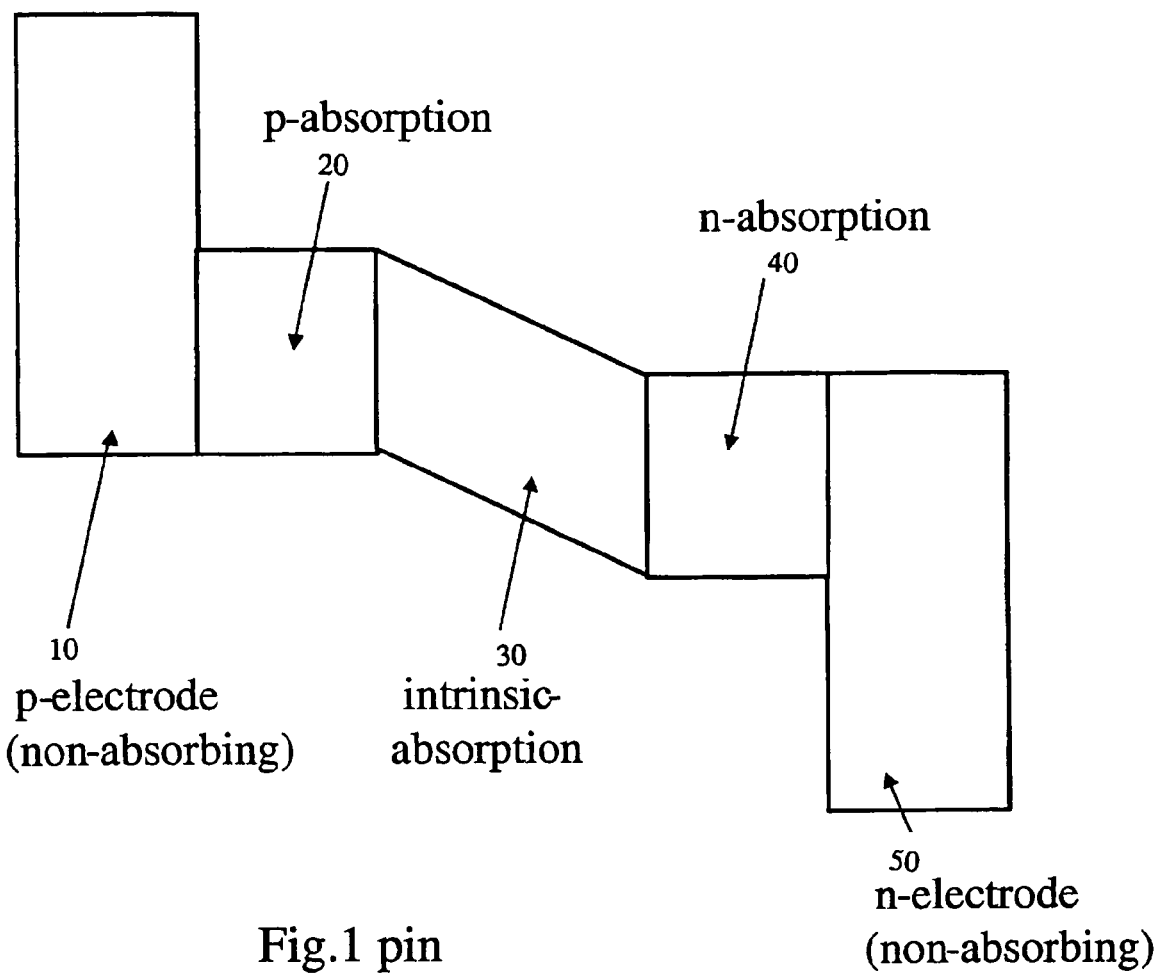
Fig.1 pin

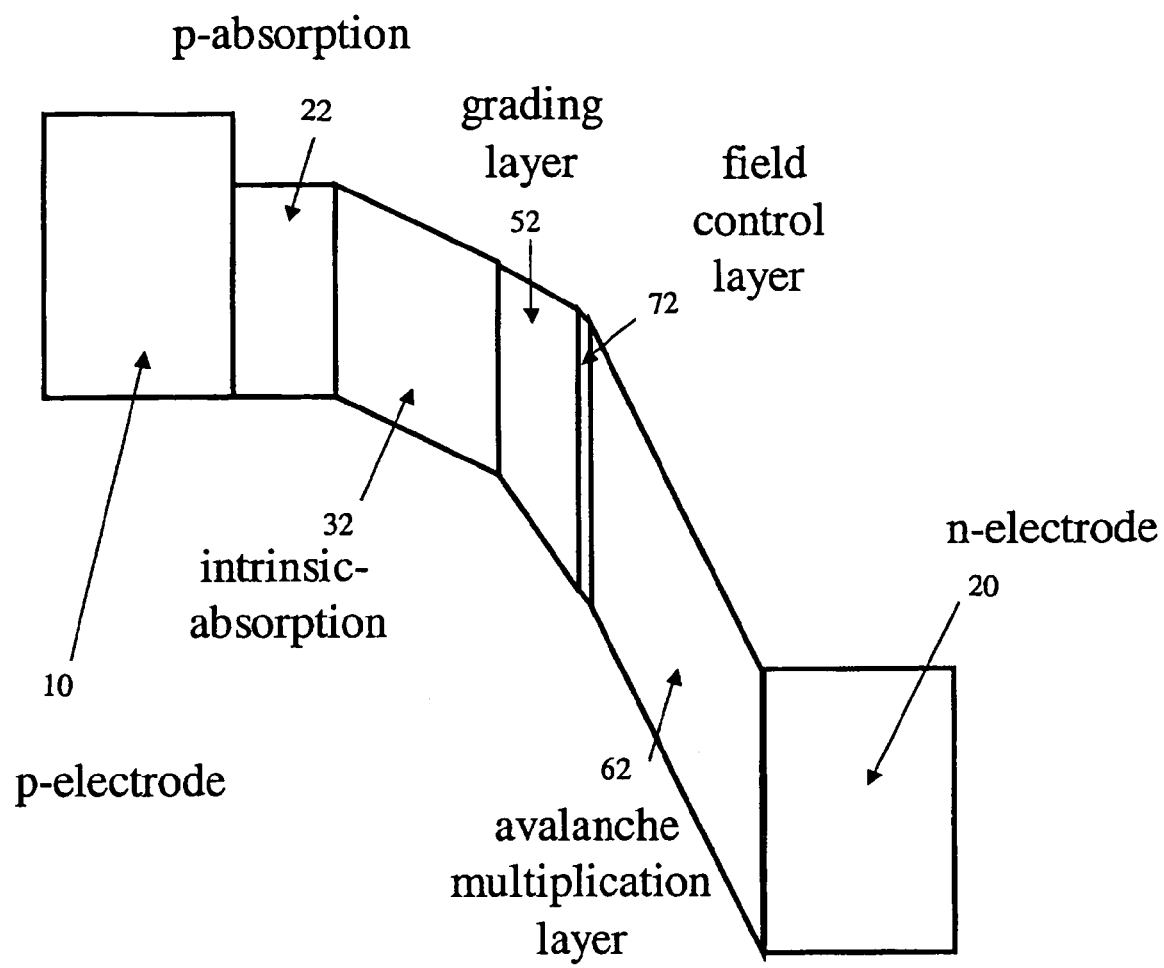
Fig.2 SAM-APD

DOPED ABSORPTION FOR ENHANCED RESPONSIVITY FOR HIGH SPEED PHOTODIODES

CROSS-REFERENCE TO RELATED APPLICATIONS

The present application is a continuation-in-part application of U.S. patent application Ser. No. 10/304,202, filed on Nov. 26, 2002, now abandoned and claims priority of U.S. Provisional Patent Application No. 60/333,616 filed on Nov. 27, 2001, entitled "Doped Absorption for Enhanced Responsivity-Bandwidth Limit and Doped Quarternary Stack for the Reduction of Carrier Trapping in High-Speed High Sensitivity Photodiodes", assigned to the assignee of the present application, and the disclosures of which are incorporated herein.

FIELD OF THE INVENTION

This invention relates to photodiodes, such as p-i-n photodiodes (PINs) and avalanche photodiodes (APDs); and, more particularly to a diode structure that provides an enhanced responsivity, and, therefore, enhanced sensitivity, without compromising speed.

BACKGROUND OF THE INVENTION

Various photodiode structures are known and the goal in designing these structures depends upon which response characteristics are to be optimized. By way of example, U.S. Pat. No. 5,818,096 in the names of Ishibashi, et al. issued Oct. 6, 1998 entitled Pin Photodiode with Improved Frequency Response and Saturation Output is incorporated herein by reference. Other references in the field related to semiconductor devices are:

S. M. Sze, *Semiconductor Devices—Physics and Technology*, Section 7.4 on p.283.

Ben. G. Streetman, *Solid State Electronic Devices*, 3rd edition, Sec.6.3.3 on pp.217–219, with emphasis on FIGS. 6–17.

K. Kato et al., "*Design of Ultrawide-Band, High-Responsivity p-i-n Photodetectors*", IEICE Trans. Electron., Vol.E76-C, No.2, pp. 214–221, February 1993.

Kazutoshi Kato, "*Ultrawide-Band/High-Frequency Photodetectors*", IEEE Trans. Microwave Theory and Techniques, pp.1265–1281, Vol. 47, Nov. 7, 1999.

S. L. Chuang, *Physics of Optoelecironic Devices*, Wiley Series in Pure and Applied Optics, John Wiley and Sons, 1995.

J. N. Hollenhorst, "*Frequency Response Theory for Multilayer Photodiodes*", Journal of Lightwave Technology, Volume 8, Issue 4, pp. 531–537, 1990.

Jie YAO, K. K. Loi, P. Baret, S.Kwan, M. A. Itzler, "*Bandwidth Simulations of 10Gb/S Avalanche Photodiodes*", The 14th Annual Meeting of the IEEE Lasers and Electro-Optics Society, 2001. LEOS 2001. 2, 699–700, 2001.

The pin photodiode taught by Ishibashi is a structure capable of improving the frequency response and the saturation output while maintaining a small RC time constant.

In FIG. 2b of the Ishibashi et al. patent a band diagram of a photodiode in one embodiment has an undoped intrinsic traveling layer serving as a non-absorbing carrier layer. FIG. 9b of the '096 patent is described to be prior art, in contrast with the invention of Ishibashi et al. The only absorption layer within this prior art embodiment of FIG. 9b described and shown by Ishibashi et al., is intrinsic carrier traveling layer, which is light-absorbing.

In contrast to the teaching and invention of Ishibashi et al, and in contrast with the device that he describes as prior art, this invention provides a doped absorption structure for enhanced responsivity x bandwidth by creating at least one of the p-doped or n-doped layers for absorption of light in addition to having a commonly used intrinsic light-absorbing layer. The electrodes are made of non-absorbing high-bandgap material, while the absorption layers are made of low-bandgap material.

The device in accordance with a preferred embodiment, this invention can be viewed as a conventional PIN having n-doped and p-doped absorption layers. In contrast Ishibashi in U.S. Pat. No. 5,818,096 teaches a structure that is absent an n-absorption layer, and, more importantly, is absent an intrinsic absorption, small bandgap layer in accordance with this invention and provides instead an intrinsic non-absorbing (large bandgap) carrier transport layer.

The Ishibashi et al. disclosure teaches a pin diode with high-saturation power; this is at a cost of low responsivity and hence low sensitivity. The design in accordance with this invention provides for high-responsivity and hence high-sensitivity at a cost of lower-saturation power. Hence the structure and response characteristics of the invention described herein are substantially different than the structure described by Ishibashi et al.

The operating characteristics of a conventional pin falls somewhere in between Ishibashi's design and the device in accordance with this invention; notwithstanding, all three designs are high-speed devices. Although the doping in FIGS. 1 and 2 is shown to be uniform, they need not be.

Another prior art reference related to p-i-n photodiodes is U.S. Pat. No. 5,684,308 to Lovejoy et al., who describe a digital photoreceiver comprising a p-i-n photodetector and an adjacent heterojunction bipolar transistor (HBT) formed on the same InP semiconductor substrate, the plurality of constituent InP/InGaAs layers being deposited by a standard epitaxial crystal growth process. The p-i-n photodiode taught by Lovejoy et al. shares the same epitaxial layers as the base and collector of the HBT amplifier. Lovejoy advantageously integrates two devices in the same epitaxial layers; this is highly practicably when the two are similar devices with similar optimization requirements. However, severe compromises must be made when the two devices integrated, in this instance, the p-i-n photodiode and the transistor, are very different and require opposite optimization schemes. For example, with HBT, in order to obtain power amplification from the transistor, the base sheet resistance has to be minimized, and hence the InGaAs base is heavily doped (1e19 $cm^{-3}$). The heavy doping of the base, in turn, enhances minority carrier recombination, which reduces gain. The heavy doping of the base also reduces carrier mobility, and therefore, reduces the base transit speed. Consequently, the heavily doped base must be very thin to having both the gain and speed. In the embodiment taught by Lovejoy et al, the p-i-n photodiode shares the same epitaxial layers, and hence, the same characteristics are observed. Due to the negligible thickness compared with the collector junction, the heavily doped thin base layer has a minimal effect on enhancing optical responsivity. On the other hand, the very heavy doping in the thin base for example 1e19 $cm^{-3}$, adversely affects the photodiode speed by reducing the carrier mobility, and adversely affects responsivity by enhancing minority carrier recombination. As a result, the heavily doped thin base InGaAs layer minimally improves the responsivity-bandwidth-product (RBP), if at all.

In contrast, with Lovejoy, the instant invention provides an enhanced responsivity-bandwidth product by ensuring that either the p-doped and/or n-doped absorption layer has a thickness large enough such that the ratio of the thickness of the (p-doped +n-doped absorption layer)/intrinsic layer thickness≧0.17 and preferably larger than 0.20, and/or that the doping concentration $d_c$ of one or both of the doped light absorption layers is in between 1e16 and 5e18 $cm^{-3}$, and wherein the concentration of any doping present in the intrinsic layer is at the most 3e15 $cm^{-3}$. Compared with Lovejoy et al., the doped absorption layers are thick enough to enhance responsivity, but not very heavily doped so as to keep mobility and speed high and to keep minority carrier recombination low. Under these conditions the doped absorption layers enhance RBP significantly.

In accordance with this invention, the use of doped absorption layers is particularly advantageous for increasing the RBP in very high-speed designs that use a very thin absorber layer. Carrier diffusion in the doped and undepleted absorption layers add negligible transit time, while adding significantly to responsivity, thereby increasing the RBP. The small-depleted portion of doped absorption layer in InGaAs instead of in InP also adds to the total absorber thickness, while keeping unchanged total depletion width, although improvement due to this second mechanism is not highly significant.

Within this specification, the term "intrinsic" shall take its ordinary meaning in the art, which is, undoped or "not intentionally-doped" or "unintentionally doped" (UID). In practice, it is not possible to produce a semiconductor to have absolutely zero dopant atom therein. Hence, the meaning of an "intrinsic" or "undoped" layer is always a UID layer. The UID level is defined by the crystal growth technology at a certain time and at a certain facility. The UID level is lower in more advanced technologies. Since the term intrinsic varies in accordance with semiconductor vendors and with materials, it's common meaning shall be used. Within this specification, the term "doped" in reference to the n-doped and p-doped layers, shall be understood to mean having a higher doping concentration than the intrinsic layer described hereafter. By way of example, the semiconductor material of InGaAs having doping at levels below 1e15 $cm^{-3}$ is considered to be UID by today's standards.

SUMMARY OF THE INVENTION

In accordance with the invention, there is provided, a photodiode comprising:
a) a semiconductor intrinsic light absorption layer having a thickness $t_i$;
b) at least one of a p-doped light absorption layer and an n-doped light absorption layer;
   wherein the p-doped light absorption layer has a thickness $t_p$ and the n-doped light absorption layer has a thickness $t_n$ and wherein $(t_p+t_n)/t_i$ is greater than or equal to 0.17; or
   wherein one of or both the p-doped light absorption layer and the n-doped light absorption layer have a doping concentration of $d_c$ in between 1e16 and 5e18 $cm^{-3}$, and wherein the concentration of any doping present in the intrinsic layer is 3e15 $cm^{-3}$ or below; and,
c) a cathode electrode and an anode electrode electrically coupled with the n-doped light absorption layer or the p-doped light absorption layer, respectively.

It should be understood that in the instance where the device is absent one of the p-doped absorption layer and the n-doped absorption layer, that the respective thickness $t_p$ or $t_n$ is equal to zero. Notwithstanding, the intrinsic absorption layer is always present, hence, namely, $t_i>0$.

In a preferred embodiment the total thickness of the doped and intrinsic light absorption layers is greater than $v/(2f_{3-dB})$ by 20% or more, where v is the drift velocity of either the electron or the hole, whichever is smaller, in the intrinsic light-absorbing layer at operating bias, wherein $f_{3-dB}$ is the frequency at which the amplitude of responsivity of the photodetector is reduced to $1/\sqrt{2}$ of its DC (low-frequency) value. When operated at high bias, the carrier drift velocity reaches the saturation value.

BRIEF DESCRIPTION OF THE DRAWINGS

Exemplary embodiments of the invention will now be described in conjunction with the drawings in which:

FIG. 1 is a band diagram for a pin photodiode with doped absorption according to the first embodiment of the present invention; and, FIG. 2 is a band diagram for an avalanche photodiode (APD) with doped absorption layer according to an embodiment of the invention.

DETAILED DESCRIPTION

Unfortunately, in a conventional pin, there is a tradeoff between speed and responsivity. To achieve high-speed, a device requires thin absorption layers so that carriers can pass through quickly before they enter the electrode. On the other hand, to achieve high responsivity, a thick absorption layer is required so that most or all photon energy is absorbed and few or none of photons are lost. This is true when the incident light is normal to the epitaxial layers. As a result, for a conventional pin, the speed X responsivity or the responsivity-bandwidth product as it is known, is essentially a constant for surface-normal light incidence. The device described by Ishibashi described heretofore, is very poor with regard to its responsivity and sensitivity but higher saturation power is attained.

In accordance with this invention, surprisingly, the speed X responsivity limit can be increased; this is of paramount importance for a high-speed avalanche photodiodes (APDs); in this instance doped absorption layers can be used; in a preferred embodiment, p-doped absorption layers are most advantageous. This structure is extremely easy to manufacture and relatively simple changes are required from that of a conventional pin/APD diode; notwithstanding the device in certain instances is significantly superior. The doped absorption layers work both as electrodes and as absorption layers, so that the carriers of the same polarity as the dopant do not have to travel across it to become collected. As long as the doped absorption layers are not so thick that the time it takes for the charged carriers to diff-use out of the doped absorption layer is equal to or longer than the required photodiode response time for a high-speed photodiode, minority carriers, namely, carriers of the polarity opposite to doping, can very rapidly diffuse out of the layers, adding very little transit-time to that of a conventional pin/APD diode. The doped absorption layers, of course, add to absorption, especially with its enhanced absorption due to doping. Hence, with the doped-absorption structure of this invention, a higher speed x responsivity limit is achieved than the conventional pin/APD diodes. For example, it is believed that a 40 G-Hz pin diode, namely, a photodiode whose 3-dB frequency in photocurrent response is 40 GHz, designed with an n and p doped absorption layer in accordance with a preferred embodiment, can achieve a 20% increase in responsivity with little or no compromise in bandwidth, i.e., keeping the 3-dB frequency of the pin diode at 40 GHz, as a very conservative estimate. Similarly, the responsivity of a SAM-APD with doped absorption in addition to the standard intrinsic absorption layer is higher than that of the corresponding conventional SAM-APD without doped absorption layer at the same bandwidth and at the same multiplication gain.

Turning now to FIG. 1, a band diagram for a 40 GHz PIN photodiode according to a first preferred embodiment of the invention is shown having an InGaAs intrinsic absorption layer 30 having a thickness of approximately 0.5–0.6 microns, sandwiched between a 0.2–0.25 micron p-doped InGaAs absorption layer 20 and a 0.020–0.025 micron-thick n-doped InGaAs absorption layer 40. The n-absorption layer is not essential. Accurate numbers are material and crystal-growth dependent, but it is preferable to be in the approximate range given above for the material system of InGaAs latticed-matched in InP with or without strain. Non-absorbing p and n InP electrodes 10 and 50 are shown at opposite ends. Preferably the entire device structure is lattice matched to InP, however this is not a requirement. For an electron-hole pair photo-generated in the intrinsic region, the electrons are collected by the n-absorption layer which also serves as an n-electrode, and the holes are collected by the p-absorption layer which serves as p-electrode, having only to travel across the intrinsic absorption, same as the conventional pin diode. By way of this design and its dimensions, added absorption is afforded mainly from the p-doped absorption layer. The doped absorption layers can, although they do not have to, be made of the same kind of material as the intrinsic absorption layer while incorporating dopants of the corresponding type (for example, Zn or Be for p-doping and Si or S for n-doping), resulting in. slightly higher absorption than the intrinsic layer. For an electron photo-generated in the p-absorption layer, it will very rapidly diffuse out of that layer and traverse the intrinsic absorption layer then to be collected by the n-absorption layer functioning as n-electrode. This process is a fractionally slower than a conventional pin, since an electron generated in the p-doped absorption layer must traverse the entire intrinsic region. However, with slightly reduced intrinsic absorption layer thickness, which is necessary only if diode speed is transit time limited, the added absorption in the p-absorption layer more than offsets the slight reduction from the slightly reduced thickness of the intrinsic absorption layer. If the diode speed is not transit-time limited, the slight reduction in the thickness of the intrinsic absorption layer is not necessary. This is similar for the holes generated in the n-doped absorption layer. Typically, the maximum thickness of the intrinsic light-absorbing layer in a corresponding conventional 40 GHz pin photodiode without the doped absorption layer(s), is only about 0.6 micron. The total thickness of all the doped and intrinsic absorption layers in accordance with this invention is at least 0.75 micron, 25% larger than its corresponding conventional pin diode. Overall, the pin with doped absorption layers breaks through the speed x responsivity limit imposed by a conventional pin diode.

FIG. 2 illustrates a band diagram of a high-speed APD with separate absorption and multiplication (SAM) in the material system of InGaAs-InAlGaAs-InAlAs, in this embodiment all lattice-matched to Inp with or without strain, according to a second preferred embodiment of the invention. The APD shown has a p-doped InGaAs absorption layer 22, followed by an InGaAs intrinsic absorption layer 32, followed by the grading 52, field-control 72 and multiplication 62 layers in a standard SAM-APD. The n-absorption layer is not required. Accurate numbers are even more material and crystal-growth dependent, and that is why they are not shown. Non-absorbing n and p InP electrodes are shown at opposite ends. The entire device structure is lattice matched to InP with or without strain. For an electron-hole pair photo-generated in the intrinsic region, the holes are collected by the p-absorption layer, which also serves as part of the p-electrode, while the electrons drift through the grading layer, get accelerated by the field control layer, and cause avalanche multiplication in the multiplication layer. The secondary holes generated by the avalanche process come back into the absorption layers, having only to traverse the intrinsic portions to get collected by the p-absorption layer serving as part of the p-electrode, same as the conventional SAM-APD. By way of this embodiment, added absorption is afforded mainly from the p-doped absorption layer, without any increase in unwanted secondary-hole drift time across the intrinsic absorption region characteristic of conventional SAM-APDs. For an electron photo-generated in the p-absorption layer, it will very rapidly diffuse out of that layer and traverse the intrinsic absorption layer then to participate in the avalanche process. Completely analogous to the pin diode, this process is a fractionally slower than a conventional SAM-APD, since an electron generated in the p-doped absorption layer must traverse the entire intrinsic region. However, with slightly reduced intrinsic absorption layer thickness, which is necessary only if diode speed is transit time limited, the added absorption in the p-absorption layer more than offsets the slight reduction from the slightly reduced thickness of the intrinsic absorption layer. If the diode speed is not transit-time limited, (avalanche-limited, or RC-limited, for example) the slight reduction in the thickness of the intrinsic absorption layer is not necessary. It should be understood that the maximum allowed thickness of the intrinsic light-absorbing layer in the corresponding conventional SAM-APD photodiode, is noticeably smaller than the total thickness of all the p-doped and intrinsic absorption layers in the device in accordance with this invention at the same bandwidth and at the same multiplication gain. Overall, the SAM-APD with doped absorption layers breaks through the speed x responsivity x gain limit that has been imposed by conventional SAM-APDs.

In summary, compared with a conventional PIN, whose InGaAs layer is not doped, a doped-absorption PIN in accordance with the invention increases the responsivity bandwidth product. The inherent speed or bandwidth of the novel PIN detector in accordance with this invention is determined by the thicknesses of the various absorption layers, including the undepleted doped absorption layer and the intrinsic and depletion layers. The responsivity of a PIN is determined mainly by the total thickness of the absorbing region. In this invention, we separate the absorption layer into doped and undoped layers. Carriers transport by diffusion in the undepleted doped region, and by drift in the undoped or depleted region. The total transit time of the carrier is the sum of diffusion time and drift time, and the responsivity of the device corresponds to the responsivity of the doped and undoped absorption layers combined. Since electron diffusion is much faster than drift for InGaAs thinner than 0.25 micron, and it is much slower than drift for InGaAs thicker than 0.25 micron, when the thickness of p-doped InGaAs is around 0.3 microns, and the thickness of the intrinsic InGaAs is around 0.5 microns (similar to the conventional 40 GHz-pin), then the diffusion time is negligible compared to the drift time, and the 0.3 micron p-doped InGaAs does not contribute significantly to reduce the speed, while it contributes about an additional 60% of responsivity. In addition, the following mechanism also contributes slightly to the enhancement of RBP: In a conventional double-heterostructure PIN, the depletion region in the transparent higher-bandgap adjacent layers add a small amount to transit-time, hence reducing speed without increasing responsivity; Doping the absorption layer at the edges can allow increase of the thickness of the absorption region, hence responsivity, without increasing the total depletion region thickness.

Numerous other embodiments may be envisaged, without departing from the spirit and scope of the invention.

What is claimed is:

1. A method of generating an electrical current in response to light comprising the steps of:

(a) absorbing light by a light-absorption intrinsic semiconductor layer having a thickness ti, a doping concentration below $5e14$ cm$^{-3}$, and producing, in response to light absorbed by said light-absorption intrinsic semiconductor layer, electrical carriers that are transported therethrough;

(b) absorbing light by a first light absorption doped semiconductor layer doped with one of p- and n-conductivity type-determining impurities, having a thickness td1, and a first doping concentration $dc_1$ between $1e17$ and $2e18$ cm$^{-3}$, said first light absorption doped semiconductor layer having a first surface thereof abutting a first surface of said light absorption intrinsic semiconductor layer, and producing, in response to light absorbed by said first light absorption doped semiconductor layer, electrical carriers that are transported therethrough, and wherein td1/ti is greater than or equal to 0.17; and (c) extracting electrical current comprised of said carriers produced by and transported through said light-absorption intrinsic semiconductor layer and said first light absorption doped semiconductor layer, by means of a first electrode electrically coupled to said first light absorption doped semiconductor layer, and a second electrode electrically coupled to said light absorption intrinsic semiconductor layer, wherein step (b) further comprises absorbing light by a second light absorption doped semiconductor layer doped with the other of said p- and n-conductivity type-determining impurities, having a thickness td2, and a second doping concentration $dc_2$ between $1e17$ and $2e18$ cm$^{-3}$, said second light absorption doped semiconductor layer having a first surface thereof abutting a second surface of said light absorption intrinsic semiconductor layer that is spaced apart from said first surface of said light absorption intrinsic semiconductor layer by material of said light absorption intrinsic semiconductor layer therebetween, and producing, in response to light absorbed by said second light absorption doped semiconductor layer, electrical carriers that are transported therethrough, and wherein (td1+td2)/ti is greater than or equal to 0.17, and step (c) comprises extracting said electrical current, comprised of said carriers produced by and transported through said light-absorption intrinsic semiconductor layer and said first and second light absorption doped semiconductor layers, by means of said first electrode electrically coupled to said first light absorption doped semiconductor layer, and said second electrode electrically coupled to said second light absorption doped semiconductor layer.

2. The method according to claim 1, wherein said first light absorption doped semiconductor layer comprises a light absorption p-doped semiconductor layer and said second light absorption doped semiconductor layer comprises a light absorption n-doped semiconductor layer, and wherein step (c) comprises extracting said electrical current by means of a p-doped anode electrode electrically coupled to a second surface of said light absorption p-doped semiconductor layer, and an n-doped cathode electrode electrically coupled to a second surface of said light absorption n-doped semiconductor layer.

3. The method according to claim 1, wherein the total thickness td1+td2+ti of said first and second light absorption semiconductor layers and said light absorption intrinsic semiconductor layer is greater than $v/(2f_{3-db})$ by 20% or more, where v is the saturation drift velocity of either an electron or a hole, whichever is smaller, in said light absorption intrinsic semiconductor layer, and wherein $f_{3-dB}$ is the frequency at which the amplitude of responsivity of said method is reduced to $1/\sqrt{2}$ of its DC low-frequency value.

4. The method according to claim 1, wherein, for a 3-dB bandwidth frequency of 40 GHz or higher, said first and second light absorption doped semiconductor layers and said light absorption intrinsic semiconductor layer are InGaAs lattice-matched to InP, and the total thickness (td1+td2+ti) of said first and second light absorption doped semiconductor layer and said light absorption intrinsic semiconductor layer is greater than 0.60 microns.

5. The method according to claim 1, wherein, for a 3-dB bandwidth frequency of 40 GHz or higher, said first and second light absorption doped semiconductor layers and said light absorption intrinsic semiconductor layer are InGaAs lattice-matched to InP, and the total thickness (td1+td2+ti) of said first and second light absorption doped semiconductor layer and said light absorption intrinsic semiconductor layer is greater than 0.65 microns.

6. The method according to claim 1, wherein, for a 3-dB bandwidth frequency of 40 GHz or higher, said first and second light absorption doped semiconductor layers and said light absorption intrinsic semiconductor layer are InGaAs lattice-matched to InP, and the total thickness (td1+td2+ti) of said first and second light absorption doped semiconductor layer and said light absorption intrinsic semiconductor layer is greater than 0.70 microns.

* * * * *